United States Patent [19]
Tsubone

[11] Patent Number: 5,811,978
[45] Date of Patent: Sep. 22, 1998

[54] DIAGNOSTIC CIRCUIT FOR CHECKING CAPACITY OF CONDENSER

[75] Inventor: Kenji Tsubone, Toyota, Japan

[73] Assignee: Toyota Jidosha Kabushiki Kaisha, Toyota, Japan

[21] Appl. No.: 620,537

[22] Filed: Mar. 25, 1996

[30] Foreign Application Priority Data

Apr. 13, 1995 [JP] Japan .................................. 7-113672

[51] Int. Cl.⁶ .................................................. G01R 31/12
[52] U.S. Cl. .......................... 324/678; 324/548; 324/519; 340/436
[58] Field of Search .................................. 324/678, 548, 324/519; 327/313; 340/435, 436

[56] References Cited

U.S. PATENT DOCUMENTS

| | | | |
|---|---|---|---|
| 3,268,658 | 8/1966 | Schroeder | 327/313 |
| 3,414,792 | 12/1968 | Mui et al. | 324/548 |
| 3,944,853 | 3/1976 | Cooper | 327/313 |
| 4,744,369 | 5/1988 | Kroll | 327/313 |
| 4,858,055 | 8/1989 | Okitaka | 327/313 |
| 5,329,174 | 7/1994 | Chiang | 324/313 |
| 5,461,321 | 10/1995 | Sanders et al. | 324/678 |
| 5,479,103 | 12/1995 | Kernahan et al. | 324/628 |
| 5,594,349 | 1/1997 | Kimura | 324/548 |
| 5,646,539 | 7/1997 | Codina | 324/678 |
| 5,677,634 | 10/1997 | Cooke et al. | 324/519 |

FOREIGN PATENT DOCUMENTS

A-6-207959  7/1994  Japan .
U-6-53981   7/1994  Japan .

*Primary Examiner*—Maura K. Regan
*Attorney, Agent, or Firm*—Oliff & Berridge, PLC

[57] ABSTRACT

A diagnostic circuit for checking a capacity of a backup condenser having a check circuit in which the clamp means includes a Zener diode and a transistor connected in parallel with the backup condenser and the current flowing through a charge resistor, the Zener diode and the transistor during a time B that the transistor is turned on by a microprocessor, results in the terminal voltage of the backup condenser to be clamped to a predetermined clamp voltage.

28 Claims, 6 Drawing Sheets

DIAGNOSTIC CIRCUIT FOR CHECKING CAPACITY OF CONDENSER

BACKGROUND OF THE INVENTION

1. Field of Invention

This invention relates to a diagnostic circuit for checking capacity of a backup condenser utilized in an airbag system installed in a car. In particular, this invention restrains the terminal voltage of the backup condenser so as not to rise during a primary check when an ignition switch is turned on. Therefore, the margin capacity of the backup condenser necessary for capacity diagnosis can be reduced. Additionally the size of the backup condenser can be reduced thereby reducing the cost.

2. Description of Related Art

Recently, in order to safely protect persons riding in a car when a car collision occurs, a protection apparatus, such as an airbag system for protecting persons in the car, is installed. The airbag system has a backup condenser which is charged when the ignition switch of the car is turned on.

The backup condenser is connected to an electric line parallel with an electric line in which both a power source and a squib are serially connected. The backup condenser is utilized for inflating the airbag by firing the squib. Therefore, it is necessary to constantly check whether capacity of the backup condenser is normal or not. A capacity check of the backup condenser is generally conducted during a primary check which occurs when the ignition switch is turned on. Conventionally there are various diagnostic circuits for checking the capacity of the backup condenser.

For instance, Japanese Utility Model Application Laid Open No. Hei 6-53,981 discloses a diagnostic circuit for checking capacity of a condenser. In the diagnostic circuit, a serial circuit including a switching means for controlling flow of discharge current from the condenser and a discharge resistor, is connected in parallel with the condenser which is charged by a direct current power source. After the condenser is discharged through the switching means within a predetermined time since the power source is activated, a charge start signal is transmitted to the switching means through an interface means after the predetermined time is elapsed. Thereby, charge of the condenser is started, and after the predetermined time is elapsed, capacity check of the condenser is conducted by comparing the charged voltage of the condenser and the power source voltage through CPU.

Accordingly in a conventional diagnostic circuit, the condenser is forcibly discharged after the ignition switch is turned on. Thus the condenser can be charged and measured from 0 V (volt). Further, a capacity check of the condenser can be performed without complex calculation by measuring both the charged voltage in the condenser and the power source voltage.

However, in the diagnostic circuit for condenser capacity disclosed in Japanese Utility Model Application Laid Open No. Hei 6-53,981, it is necessary to discharge the condenser every time the capacity check is performed. In this case, according to electric charge quantity already charged in the condenser, discharge time of the condenser is inevitably fluctuated. Therefore, in order to correctly check the capacity of the condenser, the discharge time must usually be determined from a period beginning when the condenser is fully charged. Thus, when the condenser has a large capacity, it takes a long time to fully discharge the condenser and a long time to check the condenser capacity.

Accordingly, it takes a long time to conduct the primary check. As a result, a problem arises in the conventional art, wherein the condenser takes a very long time to achieve a state where it can be assured to fire the squib after the power source is supplied.

If the discharge of the condenser does not occur every time the capacity is checked, then the capacity check of the backup condenser is continuously conducted through a microprocessor after the ignition switch is turned on. However, it takes a comparatively long time until the microprocessor starts to check the capacity of the backup condenser after the ignition switch is turned on, for the following reasons.

First, it takes some time until a power source voltage for the microprocessor reaches a necessary voltage to initially drive the microprocessor until the ignition switch is turned on. Further, the microprocessor is reset when initially driven. Second, the primary check which includes checking the voltage drop of the power source and whether trouble exist in the squib or indicator lamp, is conducted prior to the capacity check of the backup condenser and after the microprocessor is initially driven. Therefore, at the time that the microprocessor can start checking the capacity of the backup condenser, the backup condenser reaches to a state wherein the charge is considerably progressed and the terminal voltage is high. It is well known that the voltage in the backup condenser slowly changes, regardless of its capacity. Thus, it is difficult to check the capacity of the backup condenser. Though it is conceivable that the capacity of the backup condenser including electrostatic capacity is large enough to restrain an increase of the charge voltage in the backup condenser, such a backup condenser inevitably becomes large-scale and as a result, the cost for the backup condenser rises.

SUMMARY OF THE INVENTION

Accordingly, it is an object of the present invention to overcome the above mentioned problems and to provide a diagnostic circuit for checking capacity of a condenser in which terminal voltage of the condenser is restrained so as not to rise during a period until primary check, including various check operations when an ignition switch is turned on. As a result, the margin capacity of the condenser necessary for capacity diagnosis and the size of the condenser can be reduced. Thereby cost can also be reduced.

To accomplish the above object, a first embodiment of the invention provides a diagnostic circuit for checking capacity including a condenser connected parallel with a power source, measurement means for measuring a terminal voltage of the condenser from a predetermined measuring start timing, detection means for detecting capacity of the condenser based on the terminal voltage measured by the measurement means, and restraining means for restraining the terminal voltage of the condenser so as not to rise during a time between a charge start timing from which the condenser is started to be charged by the power source and the measuring start timing by the measurement means.

According to the first embodiment, the terminal voltage of the condenser is restrained by the restraining means, preventing the voltage from rising during the period from which the condenser starts to be charged by the power source and the start of the measuring by the measurement means. After the start of the measuring, the condenser starts to be charged by the power source. Corresponding to charging of the condenser, the measurement means measures the terminal voltage of the condenser from the measuring start time and the detection means detects the capacity of the condenser based on the terminal voltage measured by the measurement means.

Therefore, since the terminal voltage is restrained by the restraining means so as not to rise between the charge start time and the measuring start time, the condenser capacity can be checked based on a low voltage. Thus, it is not necessary for the condenser to have a large margin capacity. As a result, the cost of the condenser can be reduced based on the reduced size of the condenser.

The second embodiment of the invention provides a diagnostic circuit for checking capacity including a condenser connected in parallel with a power source, measurement means for measuring a terminal voltage of the condenser from a predetermined measuring start time, detection means for detecting capacity of the condenser based on the terminal voltage measured by the measurement means, and charge control means for charging the condenser according to a first charging mode between a time from which the condenser starts to be charged by the power source and the start of measuring by the measurement means and a second charging mode where the condenser is charged faster than in the first charging mode after the measuring start time.

According to the second embodiment, the condenser is charged according to the first charging mode by the power source during the time between the charge start time and the measuring start time and is charged according to the second charging mode where the condenser is charged faster than in the first charging mode after the measuring start time. Thereby, the terminal voltage of the condenser is restrained so as not to rise between the charge start time and the measuring start time and checking of the condenser capacity can be conducted based on a low voltage restrained by the restraining means after the measuring start time. Thus, it is not necessary for the condenser to have such a large margin capacity. As a result, the cost of the condenser can be reduced based on the reduced size of the condenser.

The measurement means measures the terminal voltage of the condenser from the measuring start time while the condenser is charged according to the second charging mode. The detection means detects the condenser capacity based on the terminal voltage measured by the measurement means.

As stated above, checking of the condenser capacity is conducted when the condenser has a voltage charged according to the first charging mode. Therefore, checking of the condenser capacity can be performed in a short time. Further, if the diagnostic circuit is utilized in a car airbag system to inflate an airbag, electric energy necessary for firing a squib is usually charged in the condenser, thus it can assure that the squib is certainly fired.

The above and further objects and novel features of the invention will more fully appear from the following detailed description when the same is read in connection with the accompanying drawings. It is to be expressly understood, however, that the drawings are for purpose of illustration only and not intended as a definition of the limits of the invention.

BRIEF DESCRIPTION OF THE DRAWINGS

The invention will be described with reference to the following drawings, wherein.

DETAILED DESCRIPTION OF PREFERRED EMBODIMENTS

A detailed description of the first embodiment of a diagnostic circuit for checking the capacity of a backup condenser embodying the present invention will be given referring to the accompany drawings.

Figure 1:
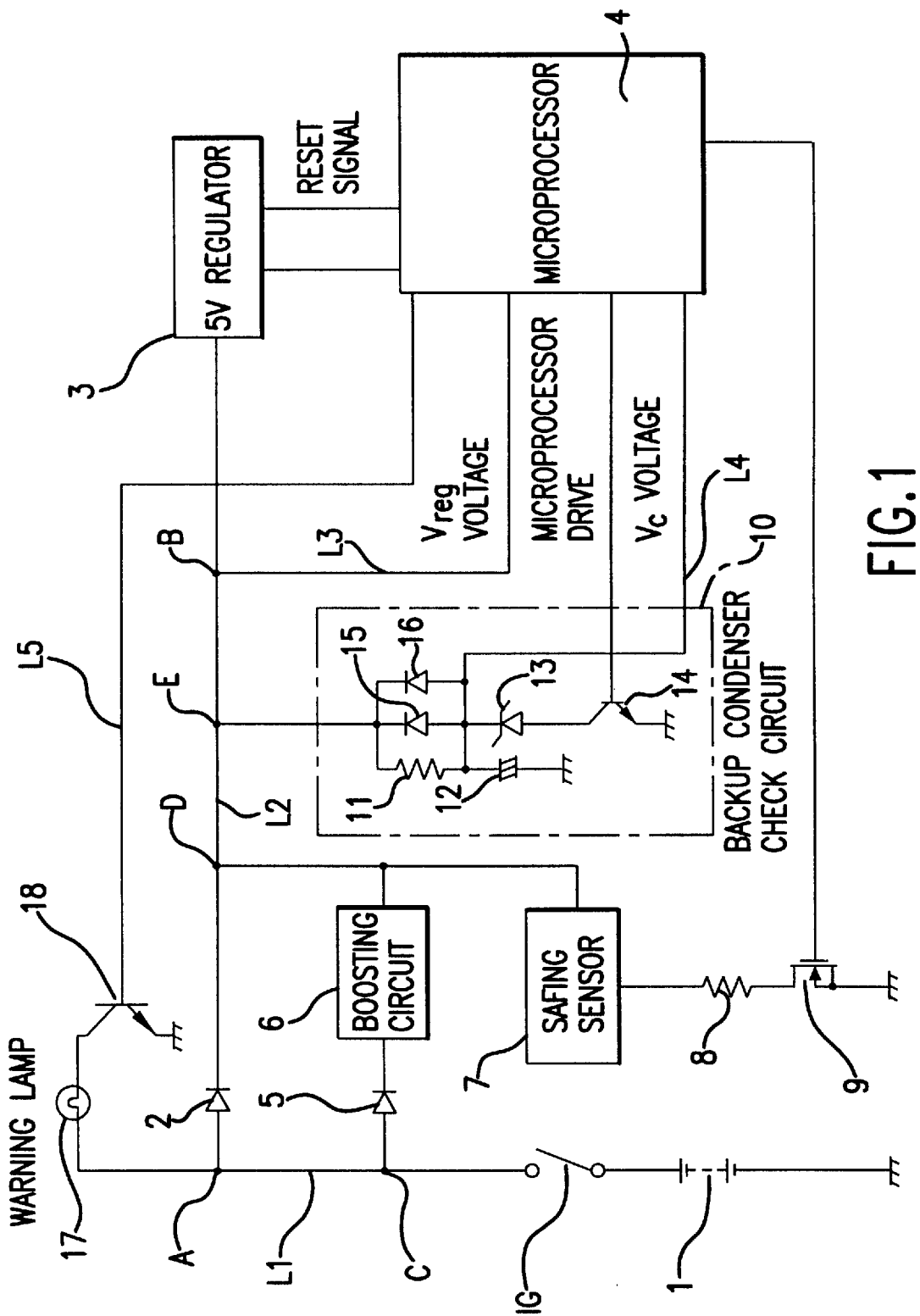
FIG. 1 is a circuit diagram indicating a diagnostic circuit for checking capacity of the backup condenser, which is utilized in the diagnostic circuit according to the first embodiment.

In FIG. 1, a negative electrode of a power source 1 is grounded and a positive electrode is connected to a line L1 through an ignition switch IG. A junction A of the line L1 is connected to a 5 V regulator 3 through a line L2 in which a protective diode 2 is inserted. Here, the 5 V regulator 3 is a constant voltage circuit producing voltage of 5 V to drive a microprocessor 4, thereby to conduct various detections and checks through the microprocessor 4.

A junction B of the line L2 is connected to the microprocessor 4 through a line L3. The line L3 is a line for detecting a power source voltage Vreg which is supplied from the power source 1 through the lines L1, L2, when the ignition switch IG is turned on. When the voltage of the power source I is detected by the line L3, a supply voltage from the power source 1 is boosted by turning on a boosting circuit 6.

From a junction C in the line L1, a protective diode 5 and a boosting circuit 6 are connected in parallel with the protective diode 2 (junction D in the line L2). Here, the boosting circuit 6 is a circuit for boosting the power source voltage of the power source 1 when turned on based on an instruction signal from the microprocessor 4, when the voltage of the power source 1 is detected. Therefore, through the boosting circuit 6, inflating ability of an airbag can be retained even if the power source voltage of the power source 1 becomes low.

At a junction D in the line L2, a safety sensor 7, a resistor 8 (which is a resistor installed in an inflator of an airbag system) and FET 9 (Field Effect Transistor) are connected. The source side of the FET 9 is grounded and the gate side is connected to the microprocessor 4. The safety sensor 7 is a well known mechanical sensor which includes a roller, a plate spring, and a stopper. The safety sensor 7 is in an on-state when a rolling contact point of the roller and a fixed contact point are mutually contacted, while the roller is decelerating more than a predetermined value. For example, the FET 9 is turned on when the microprocessor 4 outputs a drive signal to the gate of the FET 9, to inflate the airbag based on the analysis of an acceleration wave also called a G wave, which is detected by an acceleration sensor (not shown). Alternatively, if the safety sensor 7 is retained in an off-state, current does not flow from the power source 1 to the resistor 8. Therefore, since the resistor 8 is not heated, the airbag is not inflated. On the contrary, when both the FET 9 and the safety sensor 7 are retained in the on-state, current flows from the power source 1 to the resistor 8. Thereby, the airbag is inflated since the resistor 8 is heated. As stated above, the safety sensor 7 acts as a safety device to certainly inflate the airbag only when necessary, even if the FET 9 is turned on by the microprocessor 4.

From a junction E of the line L2, a check circuit 10 for checking the capacity of a backup condenser 12 is connected. In the check circuit 10, a charge resistor 11 and the backup condenser 12 are connected to the junction E and one terminal of the backup condenser 12 is grounded. Here, the backup condenser 12 is charged through the lines L1, L2 by the power source 1 according to charging characteristic determined by the charge resistor 11. The backup condenser 12 is utilized for inflating the airbag through the charged energy therein even if a voltage supply from the power source 1 is shut due to collision of the car.

Between the charge resistor 11 and the backup condenser 12, a Zener diode 13 and a transistor 14 are connected in parallel with the backup condenser 12. The emitter of the transistor 14 is grounded and the base is connected to the microprocessor 4. Here, the Zener diode 13 and the transistor 14 comprise a clamp means wherein the terminal voltage (charge voltage) is clamped by flowing the electric current to the transistor 14 from the Zener diode 13 when the transistor 14 is turned on and the drive current is output to the base of the transistor 14 from the microprocessor 4. When this occurs, the clamped voltage is set to a predetermined voltage, for example, 6 V higher than a voltage through which the microprocessor 4 is able to operate.

Between the charge resistor 11 and the backup condenser 12, a line L4 is connected and the other end is connected to the microprocessor 4. The line L4 is utilized for detecting the terminal voltage Vc of the backup condenser 12. The microprocessor 4 detects the terminal voltage Vc of the backup condenser 12 during a predetermined time through the line L4 and further checks the capacity of the backup condenser 12 based on the detected result.

In the check circuit 10, two protective diodes 15, 16 are arranged in parallel with the charge resistor 11. Both the protective diodes 15, 16 are utilized for preventing the voltage drop which occurs due to the discharge current flowing through the charge resistor 11 at the same time of the discharging of the backup condenser 12.

In the line L1, a warning lamp 17 and a transistor 18 are connected. The emitter of the transistor 18 is grounded and the base thereof is connected to the microprocessor 4 through a line L5. As a result of the terminal voltage Vc of the backup condenser 12 becoming lower than a predetermined voltage, the capacity drop in the backup condenser 12 is detected by the microprocessor 4. The microprocessor 4 outputs a drive signal to the base of the transistor 18 and the warning lamp 17 is lighted by the power source 1 since the transistor 18 is turned on.

Figure 2:
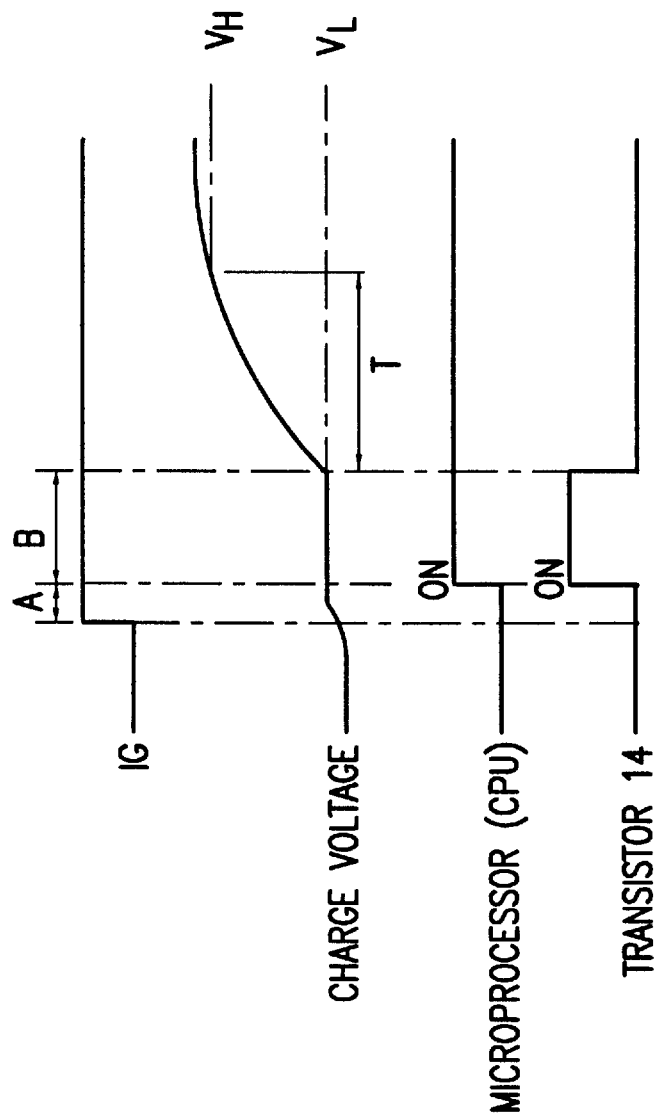
FIG. 2 is a timing chart of signals when the diagnostic circuit is operated.

Next, operation of the diagnostic circuit constructed according to the above will be described in detail with reference to FIG. 2. First, when the ignition switch IG is turned on, a reset signal is output to the microprocessor 4 through 5 V regulator 3, causing the microprocessor 4 to reset. From the time that the ignition switch IG is turned on, voltage is supplied to the backup condenser 12 through the lines L1 and L2 by the power source 1. Thus, the backup condenser 12 starts to charge according to the charging characteristic based on a resistance value of the charge resistor 11. That is, the point that the ignition switch IG is turned on becomes the charge start time. After the ignition switch IG is turned on and a time A has elapsed, the microprocessor 4 is reset and becomes operable. Thus, the point at which the time A elapses, is the set time of the microprocessor 4. At the same time, the drive signal is output to the base of the transistor 14. Thereby, the transistor 14 is turned on. After the transistor 14 is turned on, the current flows to the transistor 14 from the charge resistor 11 and the Zener diode 13. As a result, the terminal voltage Vc (charge voltage) of the backup condenser 12 is clamped to a low voltage $V_L$ which is higher than the operative voltage of the microprocessor 4, as shown in FIG. 2. The clamp voltage $V_L$ becomes a start voltage based on which capacity checking of the backup condenser 12 is started. The terminal voltage of the backup condenser 12 is retained at the clamp voltage $V_L$ during a time B while the transistor 14 is turned on.

Here, the time B will be described. During the time B, the above mentioned primary check is conducted. For example the primary check includes, checking the voltage drop of the power source 1, checking whether there are opens or shorts in the squib, and checking whether there is trouble in the warning lamp 17.

After these checking operations are finished, the capacity of the backup condenser 12 is checked. In the first embodiment, the capacity check of the backup condenser 12 starts after the microprocessor 4 becomes operable, approximately 30 ms (millisecond). This time is the time B during which the terminal voltage Vc of the backup condenser 12 is clamped to the voltage $V_L$.

After time B elapses, output of the drive signal to the base of the transistor 14 is stopped, and the transistor 14 is turned off. Thereby, clamp operation by the charge resistor 11 and the Zener diode 13 is stopped. Further, time counting is started by a timer arranged in the microprocessor 4 from the time that the transistor 14 is turned off, and the backup condenser 12 starts to charge from the clamp voltage $V_L$. Thus, the point that time B is elapsed becomes a measuring start time. While the backup condenser 12 is charging, the microprocessor 4 monitors the terminal voltage Vc of the backup condenser 12 through the line L4. The microprocessor 4 also conducts the capacity check of the backup condenser 12 by calculating both the voltages $V_L$ and $V_H$ during the time T which is counted by the timer until the terminal voltage Vc reaches to the voltage $V_H$ at which time the capacity check is finished.

Figure 5:
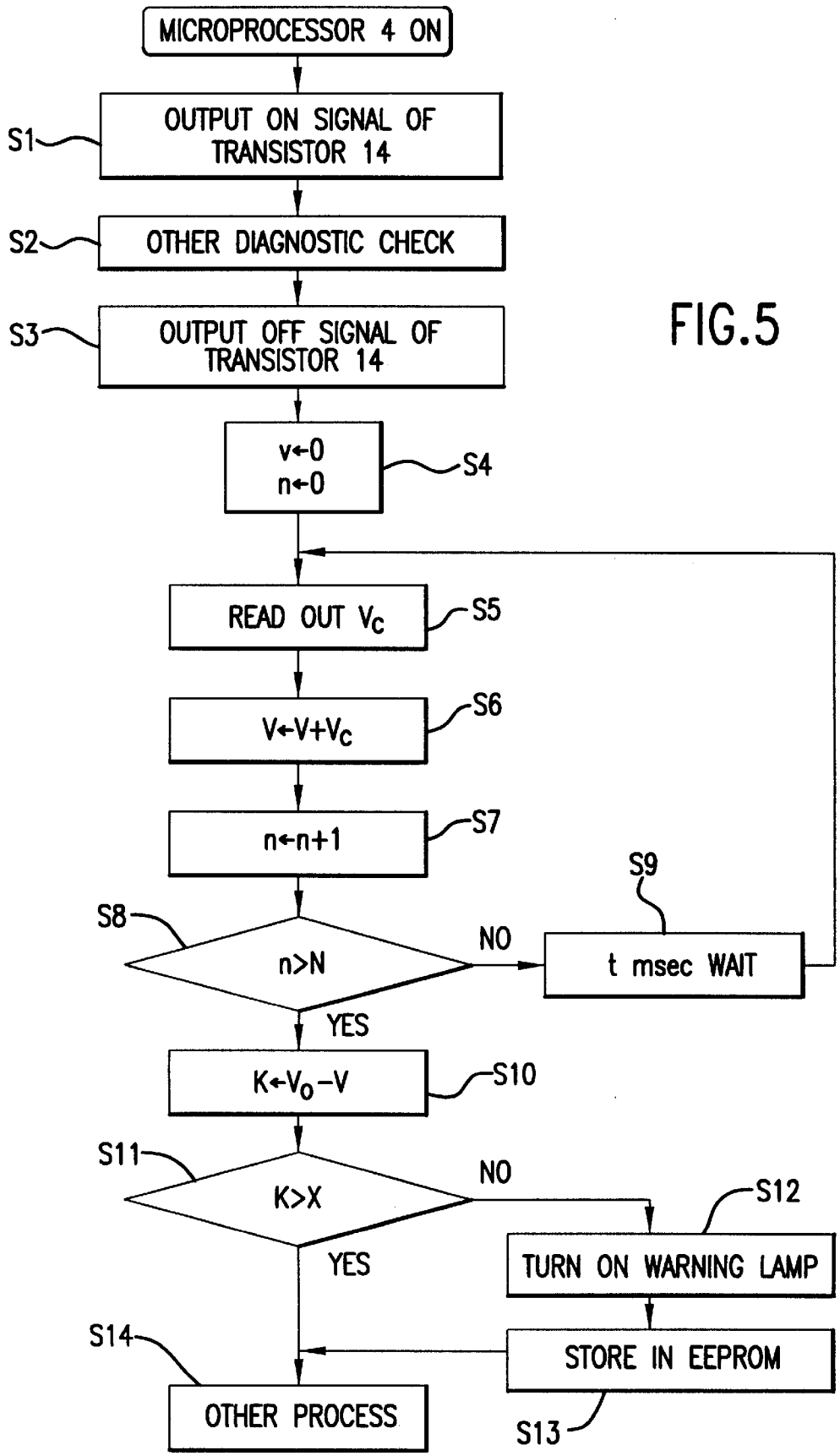
FIG. 5 is a flowchart showing the process for the capacity check of the backup condenser conducted by the microprocessor in the first embodiment.
Figure 6:
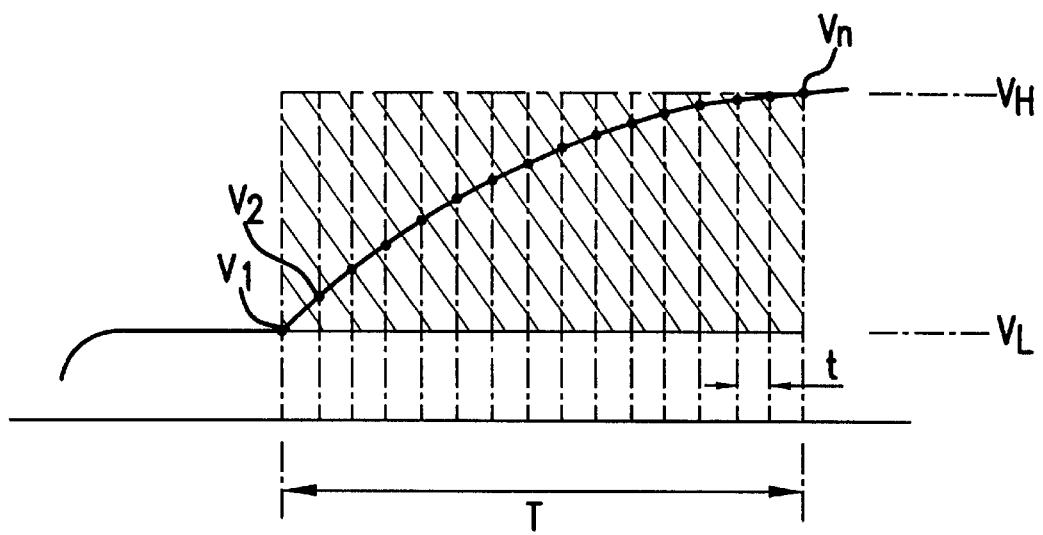
FIG. 6 is a partially enlarged view of the charge voltage in FIG. 2 to explain sampling method of the terminal voltage of the backup condenser.

A detailed explanation of the process of checking the capacity of the backup condenser 12 as conducted by the microprocessor 4, is given with reference to FIGS. 5 and 6. The process is started after the microprocessor 4 is reset by the reset signal from the 5 V regulator 3. After the microprocessor 4 becomes operable, in the ON state, the ON signal of the transistor 14 is output in step 1 (abbreviated Si hereinafter). The other diagnostic check such as the primary check including various checks is performed in S2. Thereafter, in S3, the OFF signal of the transistor 14 is output. In addition, the voltage value V and the sampling number n are set to 0 in the memory in S4. Here, the sampling number n is serially increased by 1 every time the terminal voltage Vc is read out.

In S5, the terminal voltage Vc is read out from the line L4. The voltage value V is increased by Vc in S6. Further, the sampling number n is increased by 1 in S7. In S8, it is determined whether the new sampling number n is larger than the total sampling number N. Here, the total number N indicates how many samplings are conducted during the time T with the sampling interval t, as shown in FIG. 6.

When it is determined in S8 that the sampling number n is not larger than the total sampling number N (S8:NO), the procedure returns to S5 after waiting the sampling interval t in S9. The procedures S5 to S8 are repeated until n is greater than N. While these procedures are being repeated, the voltage value V is summed in order until the sampling number n becomes larger than the total sampling number N. For example, the voltage value V becomes V (V=$V_1$,+ $V_2$+ . . . +Vn) as shown in FIG. 6 when the sampling number n becomes larger than the total sampling number N (S8:YES).

In S10 the predetermined value K is determined by subtracting the above summed voltage value V from the predetermined voltage value $V_0$. The predetermined voltage value V corresponds to the voltage value represented by the area with diagonal lines in FIG. 6. Further, the value K has a characteristic as follows. If the capacity of the backup condenser 12 is low, the backup condenser 12 is rapidly charged, and thus the summed voltage value V (V=$V_1$+$V_2$ +. . . +Vn) becomes large. At that time, the value K (K=$V_0$-V) becomes small. Therefore, it can be judged based on the value K whether the capacity of the backup condenser 12 is lowered or not. However, if the capacity of the backup condenser 12 is normal, the backup condenser 12 is not so rapidly charged, and thus the summed voltage value V (V=$V_1$+$V_2$+. . . +Vn) does not become so large.

Referring back to the flowchart in FIG. 5, after the value K is calculated in S10 according to the above, it is determined whether the value K is larger than the predetermined value X in S11. Here, the value X is a threshold value utilized for judging whether the capacity of the backup condenser 12 is permissible to inflate the airbag. If it is determined that the value K is not larger than the value X (S11:NO), it concludes that the capacity of the backup condenser 12 is lowered. As a result, the warning lamp 17 is turned on through the line L5 by the microprocessor 4 in S12. Further, in S13, it is stored in EEPROM (Electronic Erasable Programmable Read Only Memory) that the warning lamp 17 is turned on. Thereafter, the other process is conducted in S14. On the other hand, if it is judged that the value K is larger than the value X (S11:YES), it concludes that the capacity of the backup condenser 12 is high enough (normal) to inflate the airbag. Therefore, the procedure directly shifts to S14 and the other process is conducted.

Here, the capacity check of the backup condenser 12 is conducted in S11 by comparing the value K with the value X, without directly comparing the voltage values. The reason is as follows. If the backup condenser 12 is broken and open, the charge voltage rises in a moment at the charge start time. In this case, the charge voltage becomes like a rectangular wave. In such case, the value K becomes approximately 0 (zero), and K is less than X, similar to the case when the capacity of the backup condenser 12 is lowered. Thus, the warning lamp 17 is turned on in S12.

As a result of the capacity check being performed according to the above, when the capacity of the backup condenser 12 goes below a level lower than the predetermined value, the microprocessor 4 outputs the drive signal to the base of the transistor 18 through the line L5 and turns on the transistor 18. Thereby, the warning lamp 17 is lighted by the power source 1.

According to the first embodiment, in the diagnostic circuit for checking capacity of the backup condenser 12, the clamp means comprising the Zener diode 13 and the transistor 14 is connected in parallel with the backup condenser 12 in the check circuit 10. The current flowing through the charge resistor 11, the Zener diode 13 and the transistor 14 during the time B when the transistor 14 is turned on by the microprocessor 4, clamps the terminal voltage Vc of the backup condenser 12 is to the predetermined clamp voltage $V_L$. Therefore, the terminal voltage Vc of the backup condenser 12 can be efficiently restrained to prevent it from rising until the capacity check of the backup condenser 12 is conducted. The capacity check is conducted after the primary check which includes various checking operations which are conducted after the ignition switch IG is turned on.

Thus, the rise of the terminal voltage Vc in the backup condenser 12 can be restrained, without discharging the backup condenser before the capacity is checked as in the conventional diagnostic circuit. As a result, the capacity check can be conducted using the predetermined clamp voltage $V_L$ as the start voltage. Thus, it is not necessary to enlarge the electrostatic capacity of the backup condenser 12. Accordingly, the margin capacity of the backup condenser 12 can be reduced. Further cost of the backup condenser 12 can be reduced by reducing the size.

In addition, the clamp voltage $V_L$ is set to a voltage which is higher than the voltage needed to place the microprocessor 4 in an operable state. Thus, even if clamp operation by the clamp means is continued due to troubles occurring in the transistor 14, for example, the collector and the emitter in the transistor 14 are mutually shorted, the microprocessor 4 can be correctly operated even in the worst case, and the transistor 18 can be turned on. Therefore, by lighting the warning lamp 17 through the transistor 18, a user can be made aware that the collector and the emitter in the transistor 14 are mutually shorted.

Next, a diagnostic circuit for checking the capacity of a backup condenser according to the second embodiment will be described in accordance with FIGS. 3 and 4. Here, the diagnostic circuit of the second embodiment has basically the same construction as the diagnostic circuit of the first embodiment. However, the difference between the second embodiment and the first embodiment as follows. In the first embodiment, the clamp means included the Zener diode 13 and the transistor 14 is arranged so as to be connected in parallel with the backup condenser 12. However, in the second embodiment, the terminal voltage of the backup condenser is restrained from increasing due to the charge resistor having high resistance, within a predetermined time until a predetermined charge start time after the ignition switch is turned on. Further the capacity check of the backup condenser is conducted while quickly charging the backup condenser by lowering total resistance value against the backup condenser after the predetermined charge start time.

Figure 3:
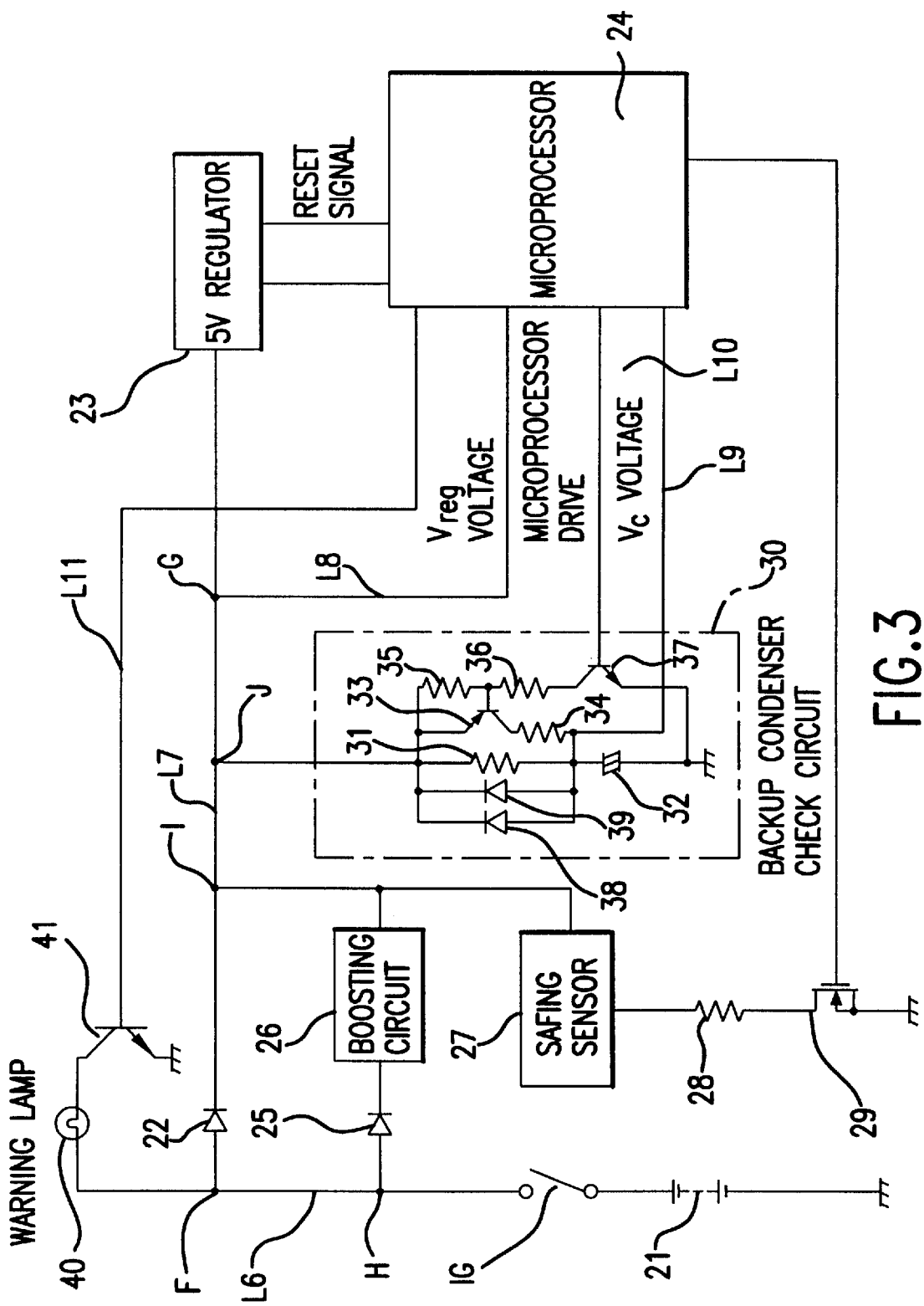
FIG. 3 is a circuit diagram indicating a diagnostic circuit for checking capacity of the backup condenser, which is utilized in the diagnostic circuit according to the second embodiment.
Figure 4:
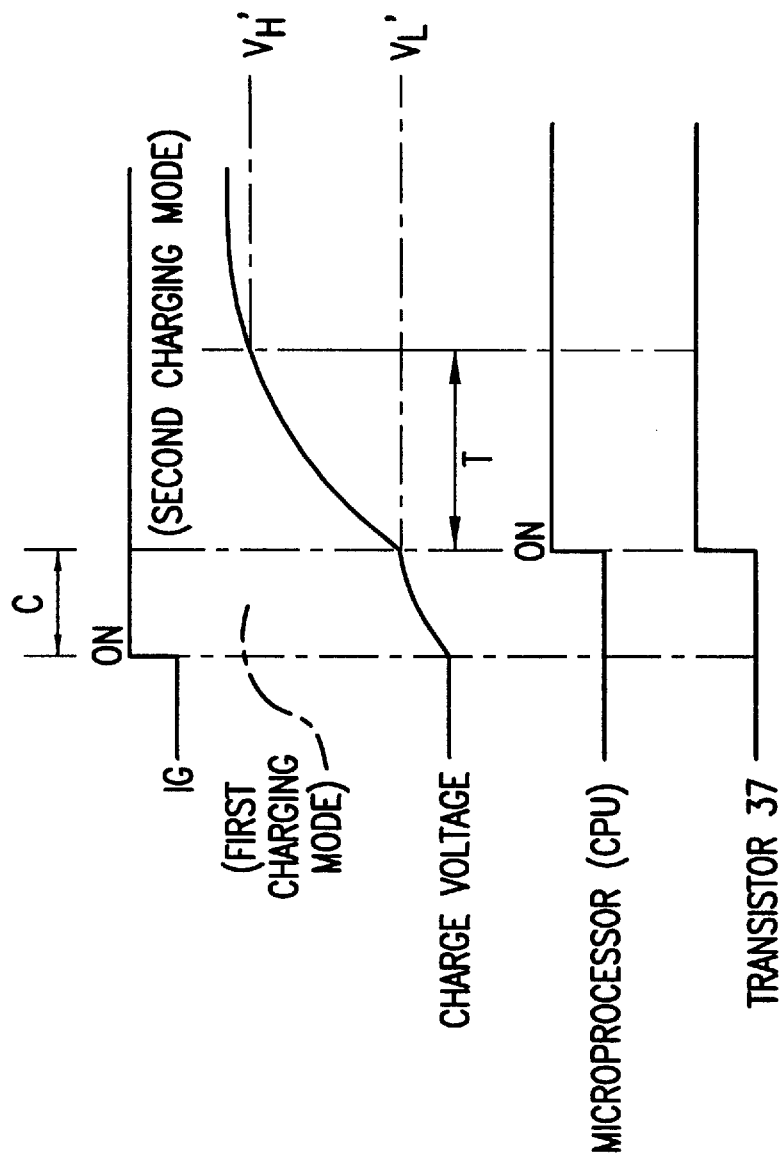
FIG. 4 is a timing chart of signals when the diagnostic circuit is operated.

In FIG. 3, a negative electrode of a power source 21 is grounded and a positive electrode is connected to a line L6 through the ignition switch IG. A junction F of the line L6 is connected to a 5 V regulator 23 through a line L7 in which a protective diode 22 is inserted. Here, the 5 V regulator 23 is a constant voltage circuit producing voltage of 5 V to drive a microprocessor 24, to conduct various detections and checks through the microprocessor 24.

A junction G of the line L7 is connected to the microprocessor 24 through a line L8. The line L8 is a line for detecting a power source voltage Vreg which is supplied from the power source 21 through the lines L6 and L7, when the ignition switch IG is turned on. When the voltage of the power source 21 is detected by the line L8, a supply voltage from the power source 21 is boosted by turning on a boosting circuit 26.

From a junction H in the line L6, a protective diode 25 and a boosting circuit 26 are connected in parallel with the protective diode 22 (junction I in the line L7). Here, the boosting circuit 26 is a circuit for boosting the power source voltage of the power source 21 when turned on after receiving an instruction signal from the microprocessor 24, when the voltage down of the power source 21 is detected. Therefore, through the boosting circuit 26, inflating ability of an airbag can be retained even if the power source voltage of the power source 21 becomes low.

At a junction I in the line L7, a safety sensor 27, a resistor 28 (which is a resistor installed in an inflator of an airbag system) and FET 9 (Field Effect Transistor) are connected, similar to the first embodiment. A source side of the FET 29 is grounded and a gate side is connected to the microprocessor 24. The safety sensor 27 is a well known mechanical sensor which includes a roller, a plate spring and a stopper. The safety sensor 27 is in an on-state when a rolling contact point of the roller and a fixed contact point are mutually contacted, while the roller is decelerating more than a predetermined value. For example, the FET 29 is turned on when the microprocessor 24 outputs a drive signal to the gate of the FET 29, to inflate the airbag based on the analysis of an acceleration wave also called a G wave, detected by an acceleration sensor (not shown). On the other hand, if the safety sensor 27 is retained in the off-state, current does not flow from the power source 21 to the resistor 28. Therefore, since the resistor 28 is not heated, the airbag is not inflated. On the contrary, when both the FET 29 and the safety sensor 27 are retained in the on-state, current flows from the power source 21 to the resistor 28. Thereby, the airbag is inflated since the resistor 28 is heated. As stated above, the safety sensor 27 acts as a safety device to inflate the airbag only when necessary, even if the FET 29 is turned on by the microprocessor 24.

From a junction J of the line L7, a check circuit 30 for checking the capacity of a backup condenser 32 is connected. In the check circuit 30, a first charge resistor 31 and the backup condenser 32 are connected to the junction J and one terminal of the backup condenser 32 is grounded. Here, the first charge resistor 31 has a comparatively high resistance (which is, for example, set to 2 KW corresponding to a value approximate ten times of the resistance value of the charge resistor 11 in comparison with the first embodiment) and the backup condenser 32 is charged through the lines L6 and L7 by the power source 21 according to charging characteristic (first charging mode) determined by the first charge resistor 31. And, as mentioned hereinafter, under the first charging mode, the terminal voltage Vc (charge voltage) of the backup condenser 32 is restrained so as not to increase due to the fact that the resistance value of the first charge resistor 31 is set to the high value.

The first resistor 31 is connected in parallel with a transistor 33 and a second resistor 34. A point between the first charge resistor 31 and the backup condenser 32 and one end of the second charge resistor 34 are mutually connected to the microprocessor 24 through a line L9. The second charge resistor 34 has a comparative low resistance value, for example, 300 Q in the second embodiment. A resistor 35 is arranged between the emitter and the base of the transistor 33. Further a transistor 37 is connected to the resistor 35 through a resistor 36. The base of the transistor 37 is connected to the microprocessor 24 through a line L10 and the emitter is grounded.

Here, the line L9 is utilized for detecting the terminal voltage of the backup condenser 32. The microprocessor 24 detects the terminal voltage Vc of the backup condenser 32 during a predetermined time through the line L9 and further checks the capacity of the backup condenser 32 based on the detected result.

The charge control means includes the transistor 33, the second charge resistor 34, the resistors 35 and 36, and the transistor 37. The charge control means change from the first charging mode which corresponds to a charge characteristic determined by the first charge resistor 31 and to a second charging mode corresponding to a charge characteristic determined by both the first charge resistor 31 and the second charge resistor 34 which are connected in parallel with each other. Based on the charging mode, the transistors 37, 33 are turned on when the drive signal is output to the base of the transistor 37 through the line L10 from the microprocessor 24.

In the check circuit 30, two protective diodes 38, 39 are arranged in parallel with the first charge resistor 31. Both of the protective diodes 38, 39 are utilized for preventing the voltage drop which would occur due to the discharge current flowing through the first charge resistor 31 at the time of discharging of the backup condenser 32.

In the line L6, a warning lamp 40 and a transistor 41 are connected. The emitter of the transistor 41 is grounded and the base is connected to the microprocessor 24 through a line L11-. When the terminal voltage Vc of the backup condenser 32 becomes lower than a predetermined voltage, the capacity drop in the backup condenser 32 is detected through the line L9 by the microprocessor 24. The microprocessor 24 outputs a drive signal to the base of the transistor 41 through the line L11 and the warning lamp 40 is lighted by the power source 21 since the transistor 41 is turned on.

Next, operation of the diagnostic circuit of the second embodiment constructed according to the above will be described in detail with reference to FIG. 4. First, when the ignition switch IG is turned on, a reset signal is output to the microprocessor 24 through 5 V regulator 23, thereby resetting the microprocessor 24. From the time that the ignition switch IG is turned on, voltage is supplied to the backup condenser 32 through the lines L6 and L7 by the power source 21. Thus the backup condenser 32 starts to charge according to the first charging mode defined by the high resistance value of the first charge resistor 31. Accordingly, the point that the ignition switch IG is turned on becomes a charge start time. At that time, the terminal voltage Vc of the backup condenser 32 is restrained so as not to rise due to the high resistance value of the first charge resistor 31, as shown in FIG. 4. As a result, the terminal voltage Vc (charge voltage) of the backup condenser 32 is raised to the low voltage $V_L'$, as shown in FIG. 4.

After the ignition switch IG is turned on and a time C has lapsed, the microprocessor 24 is reset and becomes operable. At the same time, the drive signal is output to the base of the transistor 37 through the line L10. Thereby, the transistor 37 is turned on. As a result, the current flows to the transistor 37 from the resistors 35 and 36 and the transistor 33 is turned on since the current is output to its base. Therefore, the backup condenser 32 starts to charge from the low voltage $V_L'$ according to the second charging mode determined by the first charge resistor 31 and the second charge resistor 34, based on the voltage supplied through the lines L6 and L7 by the power source 21. Thus, the point that the time C elapsed becomes a measuring start time. At that time, since the total resistance value against the backup condenser 32 becomes low, the backup condenser 32 is charged in a comparatively short time, as shown in FIG. 4.

And at the same time, time starts to be counted by a timer arranged in the microprocessor 24 from the time that the transistor 37 is turned on, to the time the backup condenser 32 starts to charge from the voltage $V_L'$. While the backup condenser 32 is charging, the microprocessor 24 monitors the terminal voltage Vc of the backup condenser 32 through the line L9. The microprocessor 24 also conducts the capacity check of the backup condenser 32 by calculating both the voltages $V_L'$ and $V_H'$ during the time T which is counted by the timer until the terminal voltage Vc reaches to the voltage $V_H$. When the voltage reaches $V_H$, the capacity check is finished.

When the capacity of the backup condenser 32 goes below a level lower than a predetermined value, the microprocessor 24 outputs a drive signal to the base of the transistor 41 through the line L11 and makes the transistor 41 turned on. Thereby, the warning lamp 40 is lighted by the power source 21.

The diagnostic circuit for checking the capacity of the backup condenser 32 includes the charge control means which includes the transistor 33, the second charge resistor 34 and the resistors 35 and 36, and the transistor 37 arranged in the check circuit 30. The terminal voltage Vc of the backup condenser 32 is restrained to the voltage $V_L'$ according to the first charging mode. The first charge mode corresponds to a charge characteristic determined by only the first charge resistor 31 during the time C, wherein the transistors 37 and 33 are turned off before the microprocessor 24 is reset. The backup condenser 32 is charged from the voltage $V_L'$ according to the second charging mode. The second charge mode corresponds to a charge characteristic determined by the first charge resistor 31 and the second charge resistor 34 after the transistors 37 and 33 are turned on and the microprocessor 24 is reset.

Similar to the first embodiment, the terminal voltage Vc of the backup condenser 32 can be efficiently restrained so as not to rise until the capacity check of the backup condenser 32 is conducted. The capacity check of the backup condenser 32 is conducted after the ignition switch IG is turned on and the primary check including various checking operations is performed.

Thus, the rise of the terminal voltage Vc in the backup condenser 32 can be restrained without discharging the backup condenser before the capacity is checked as in the conventional diagnostic circuit. As a result, the capacity check can be performed by using the predetermined voltage $V_L'$ as the start voltage. Thus, it is not necessary to enlarge the electrostatic capacity of the backup condenser 32 and the margin capacity of the backup condenser 32 can be reduced. Further the cost of the backup condenser 32 can be reduced by reducing its size.

Additionally, in the diagnostic circuit of the second embodiment, although the capacity of the backup condenser 32 cannot be checked if there is trouble in the transistors 37 and 33, the backup condenser 32 is invariably charged according to the first charging mode or the second charging mode. Therefore, it can assure that the airbag is inflated based on the charged energy in the backup condenser 32.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A diagnostic circuit for checking a capacity of a condenser connected parallel with a power source, comprising:

measurement means for measuring a terminal voltage of the condenser from a predetermined measuring start time;

detection means for detecting the capacity of the condenser based on the terminal voltage measured by the measurement means; and charge control means comprising:

a first charge resistor serially connected to the condenser, the first charge resistor having a first resistance value and characterizing a first charging mode; and a second charge resistor serially connected to the condenser, the second charge resistor having a second resistance value smaller than the first resistance value and characterizing a second charging mode, wherein said charge control means charges the condenser according to the first charging mode during a time between a charge start time wherein the condenser starts to be charged by the power source and the measuring start time, and charges the condenser according to the second charging mode after the measuring start time wherein the condenser is charged faster than in the first charging mode.

2. The diagnostic circuit according to claim 1, wherein the first resistance value of the first charge resistor is a comparatively high resistance value and the first charging mode corresponds to the first resistance value.

3. The diagnostic circuit according to claim 2, wherein the resistance value of the first charge resistor is 2K $\Omega$.

4. The diagnostic circuit according to claim 2, wherein the terminal voltage of the condenser is restrained so as not to rise based on the first resistance value of the first charge resistor.

5. The diagnostic circuit according to claim 1, wherein the second charge resistor is connected in series with a first transistor, and both the second charge resistor and the first transistor are connected in parallel with the first charge resistor.

6. The diagnostic circuit according to claim 1, wherein the second resistance value of the second charge resistor is a comparatively low resistance value and the second charging mode corresponds to the second resistance value and the first resistance value.

7. The diagnostic circuit according to claim 6, wherein the second resistance value of the second charge resistor is 300 $\Omega$.

8. The diagnostic circuit according to claim 1, further comprising control means which starts to be operable at the measuring start time.

9. The diagnostic circuit according to claim 8, wherein the charge control means sets the first charging mode when the first transistor is turned off by the control means and sets the second charging mode when the first transistor is turned on by the control means.

10. The diagnostic circuit according to claim 9, wherein the control means controls the measurement means so as to monitor the terminal voltage of the condenser after the condenser starts to charge after the measuring start time according to the second charging mode.

11. The diagnostic circuit according to claim 10, wherein the control means controls the detection means so as to conduct checking of the capacity in the condenser based on a first voltage in the condenser, between the charge start time and the measuring start time, the condenser is charged according to the first charging mode, the condenser is charged for a predetermined time so that the terminal voltage rises from the first voltage to a second voltage, the checking of the capacity of the condenser is finished when the terminal voltage equals the second voltage.

12. The diagnostic circuit according to claim 8, further comprising a warning lamp and a second transistor which are serially connected to the power source.

13. The diagnostic circuit according to claim 12, wherein the control means lights the warning lamp by turning on the second transistor when the detection means detects that the capacity of the condenser is low.

14. The diagnostic circuit according to claim 1, wherein the condenser is a backup condenser utilized in a car airbag system, the backup condenser expanding an airbag even if power supply from the power source to the airbag system is shut.

15. A diagnostic circuit for checking a capacity of a condenser connected in parallel with a power source having a predetermined voltage, comprising:

measurement means for measuring a voltage across the condenser from a measuring start time;

first charging means for charging the condenser by the predetermined voltage during a time between a charge start time wherein the condenser starts to be charged and the measuring start time by the measurement means;

second charging means for charging the condenser by the predetermined voltage after the measuring start time, the second charging means charging the condenser faster than the first charging means; and detection means for detecting the capacity of the condenser based on the voltage across the condenser measured by the measurement means during a charging time by the second charging means.

16. The diagnostic circuit according to claim 15, wherein the first charging means comprises a first charge resistor serially connected to the condenser, the first charge resistor having a comparatively high resistance value and determining a first charging mode corresponding to the resistance value of the first charge resistor.

17. The diagnostic circuit according to claim 16, wherein the resistance value of the first charge resistor is 2 kΩ.

18. The diagnostic circuit according to claim 16, wherein the voltage across the condenser is restrained so as not to rise based on the resistance value of the first charge resistor.

19. The diagnostic circuit according to claim 16, wherein the second charging means comprises a second charge resistor and a first transistor, both the second charge resistor and the first transistor being connected in parallel with the first charge resistor.

20. The diagnostic circuit according to claim 19, wherein the second charge resistor has a comparatively low resistance value and determines a second charging mode in cooperation with the first charge resistor based on the resistance values of the second charge resistor and the first charge resistor.

21. The diagnostic circuit according to claim 20, wherein the resistance value of the second charge resistor is 300 Ω.

22. The diagnostic circuit according to claim 19, further comprising control means which starts to be operable at the measuring start time.

23. The diagnostic circuit according to claim 22, wherein the first charging means sets the first charging mode when the first transistor is turned off by the control means and the second charging means sets the second charging mode when the first transistor is turned on by the control means.

24. The diagnostic circuit according to claim 23, wherein the control means controls the measurement means so as to monitor the voltage across the condenser after the condenser starts to charge after the measuring start time according to the second charging mode.

25. The diagnostic circuit according to claim 24, wherein the control means controls the detection means so as to conduct checking of the capacity in the condenser based on a first voltage in the condenser, between the charge start time and the measuring start time, the condenser is charged according to the first charging mode, the condenser is charged for a predetermined time so that the voltage across the condenser rises from the first voltage to a second voltage, the checking of the capacity of the condenser is finished when the voltage across the condenser equals the second voltage.

26. The diagnostic circuit according to claim 22, further comprising a warning lamp and a second transistor which are serially connected to the power source.

27. The diagnostic circuit according to claim 26, wherein the control means lights the warning lamp by turning on the second transistor when the detection means detects that the capacity of the condenser is low.

28. The diagnostic circuit according to claim 15, wherein the condenser is a backup condenser utilized in a car airbag system, the backup condenser expanding an airbag even if power supply from the power source to the airbag system is shut.

\* \* \* \* \*